United States Patent
Peltz et al.

(10) Patent No.: US 11,537,326 B2
(45) Date of Patent: Dec. 27, 2022

(54) RELOCATION FLOW USING CBA TECHNOLOGY

(71) Applicant: Western Digital Technologies, Inc., San Jose, CA (US)

(72) Inventors: Uri Peltz, Hod Hasharon (IL); Karin Inbar, Ramat Hasharon (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/182,032

(22) Filed: Feb. 22, 2021

(65) Prior Publication Data
US 2022/0075561 A1 Mar. 10, 2022

Related U.S. Application Data

(60) Provisional application No. 63/076,760, filed on Sep. 10, 2020.

(51) Int. Cl.
| | |
|---|---|
| *G06F 3/06* | (2006.01) |
| *G06F 11/10* | (2006.01) |
| *G06F 12/10* | (2016.01) |
| *G11C 16/26* | (2006.01) |

(52) U.S. Cl.
CPC .......... *G06F 3/0659* (2013.01); *G06F 3/0604* (2013.01); *G06F 3/0679* (2013.01); *G06F 11/1068* (2013.01); *G06F 12/10* (2013.01); *G11C 16/26* (2013.01)

(58) Field of Classification Search
CPC .... G06F 3/0659; G06F 3/0604; G06F 3/0679; G06F 12/10; G11C 16/26
See application file for complete search history.

(56) References Cited

U.S. PATENT DOCUMENTS

| | | | | |
|---|---|---|---|---|
| 6,049,482 A | * | 4/2000 | Aritome | G11C 16/10 365/185.24 |
| 8,990,493 B1 | * | 3/2015 | Yu | G06F 12/0866 711/111 |
| 11,036,625 B1 | * | 6/2021 | Balluchi | G06F 12/1054 |
| 11,114,180 B1 | * | 9/2021 | Lin | G11C 29/44 |
| 2010/0332534 A1 | * | 12/2010 | Chang | G06F 16/13 707/812 |
| 2017/0345512 A1 | * | 11/2017 | Awad | G11C 16/26 |
| 2019/0146911 A1 | * | 5/2019 | Ha | G06F 12/0246 711/103 |
| 2020/0192738 A1 | * | 6/2020 | Sarkar | G06F 11/3433 |
| 2020/0266838 A1 | * | 8/2020 | Porter | H03M 13/2906 |
| 2022/0058134 A1 | * | 2/2022 | Minopoli | G06F 12/0866 |

* cited by examiner

*Primary Examiner* — Hiep T Nguyen
(74) *Attorney, Agent, or Firm* — Patterson & Sheridan, LLP; Steven H. VerSteeg

(57) ABSTRACT

The present disclosure generally relates to efficiently relocating data within a data storage device. By implementing an error correction code (ECC) module in a complementary metal oxide semiconductor (CMOS) chip for each memory die within a memory array of a memory device, the data can be relocated more efficiently. The ECC decodes the codewords at the memory die. The metadata is then extracted from the decoded codewords and transferred to a controller of the data storage device. A flash translation layer (FTL) module at the controller then checks whether the data is valid by comparing the received metadata to FTL tables. If the metadata indicates the data is valid, then the data is relocated.

18 Claims, 6 Drawing Sheets

300

| MEMORY DIE 306E | |
| CMOS 302E | ECC 304E |
| MEMORY DIE 306D | |
| CMOS 302D | ECC 304D |
| MEMORY DIE 306C | |
| CMOS 302C | ECC 304C |
| MEMORY DIE 306B | |
| CMOS 302B | ECC 304B |
| MEMORY DIE 306A | |
| CMOS 302A | ECC 304A |

FIG. 3

RELOCATION FLOW USING CBA TECHNOLOGY

CROSS-REFERENCE TO RELATED APPLICATIONS

This application claims benefit of U.S. provisional patent application Ser. No. 63/076,760, filed Sep. 10, 2020, which is herein incorporated by reference.

BACKGROUND OF THE DISCLOSURE

Field of the Disclosure

Embodiments of the present disclosure generally relate to relocating data within a data storage device.

Description of the Related Art

In data storage devices that utilize SSDs, a reverse lookup table is not maintained with an indication for each flash management unit (FMU) whether the table contents are valid or invalid. Thus, during data relocation, such as garbage collection, the controller is configured to check which FMU is valid and should be copied, and which FMU is invalid and should not be copied.

The typical manner for a validity check is to keep the LBA in the header of the FMU. During data relocation, the controller is configured to read all headers, and for each header to look for the LBA in the mapping table kept in the controller. If the mapping table indicates that the known physical location of the LBA matches the location of the FMU header, the LBA is valid and the data should be relocated. Otherwise, the FMU is not valid and the data should not be relocated.

In order to read the headers, the entire FMU plus the header is transferred from the memory device to the controller and is then decoded. Because the error correction code (ECC) codeword covers the entire FMU plus the header as a single codeword, a bottleneck is created which negatively impacts device performance.

Therefore, there is a need to more efficiently relocate data within a data storage device.

SUMMARY OF THE DISCLOSURE

The present disclosure generally relates to efficiently relocating data within a data storage device. By implementing an error correction code (ECC) module in a complementary metal oxide semiconductor (CMOS) chip for each memory die within a memory array of a memory device, the data can be relocated more efficiently. The ECC decodes the codewords at the memory die. The metadata is then extracted from the decoded codewords and transferred to a controller of the data storage device. A flash translation layer (FTL) module at the controller then checks whether the data is valid by comparing the received metadata to FTL tables. If the metadata indicates the data is valid, then the data is relocated.

In one embodiment, a data storage device comprises: a controller; and a non-volatile memory device coupled to the controller, wherein the non-volatile memory device comprises: at least one memory die; and at least one complementary metal oxide semiconductor (CMOS) device coupled to the at least one memory die, wherein the CMOS device comprises an error correction code (ECC) unit.

In another embodiment, a data storage device comprises: a controller; and a non-volatile memory device coupled to the controller, wherein the non-volatile memory device is configured to: decode data; extract metadata from the decoded data; and transfer the extracted metadata to the controller.

In another embodiment, a data storage device comprises: a controller; and a non-volatile memory device coupled to the controller, wherein the non-volatile memory device comprises means to decode data stored in the non-volatile memory device.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3 is a schematic illustration of a non-volatile memory device architecture, according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to efficiently relocating data within a data storage device. By implementing an error correction code (ECC) module in a complementary metal oxide semiconductor (CMOS) chip for each memory die within a memory array of a memory device, the data can be relocated more efficiently. The ECC decodes the codewords at the memory die. The metadata is then extracted from the decoded codewords and transferred to a controller of the data storage device. A flash translation layer (FTL) module at the controller then checks whether the data is valid by comparing the received metadata to FTL tables. If the metadata indicates the data is valid, then the data is relocated.

Figure 1:
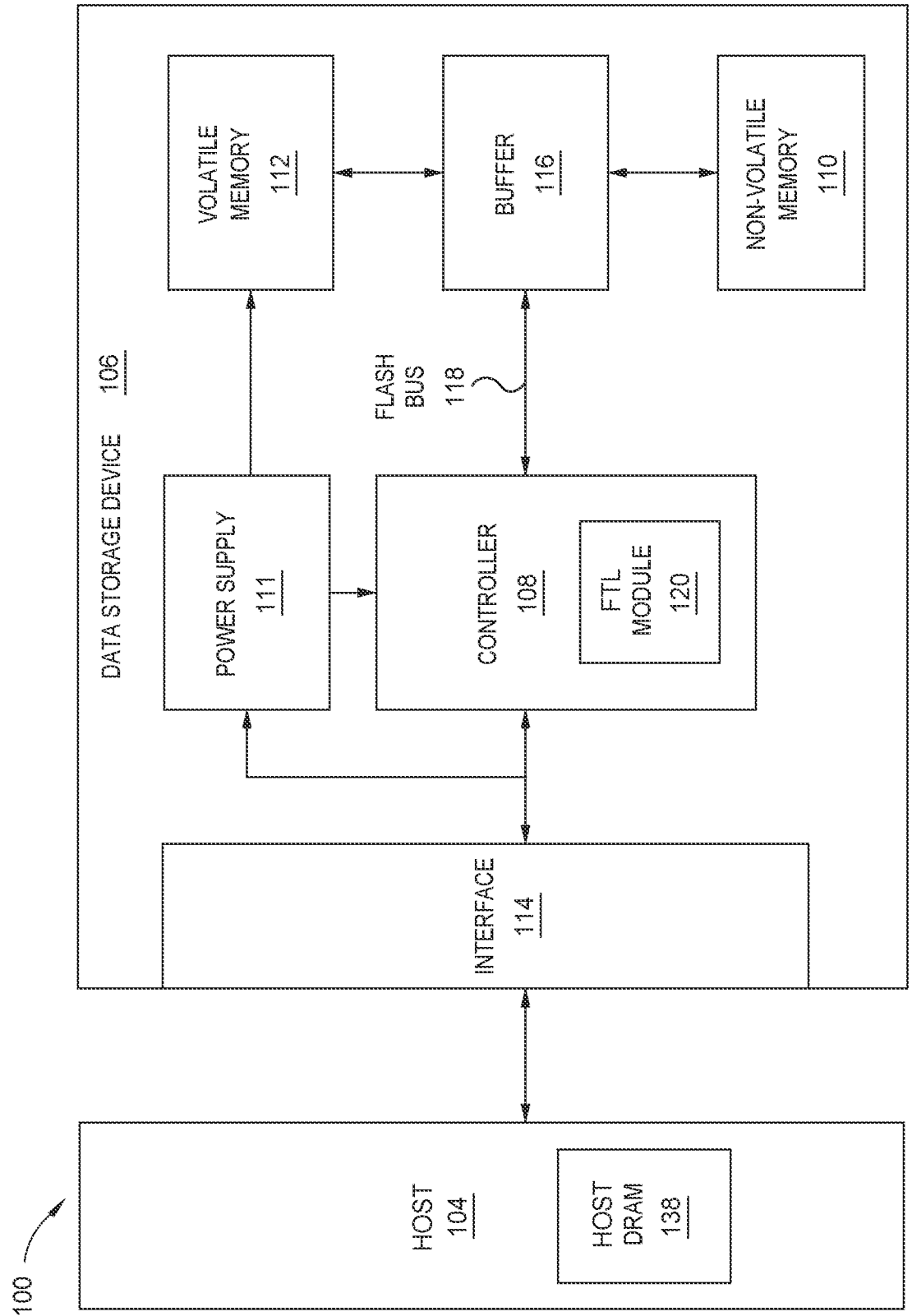
FIG. 1 is a schematic block diagram illustrating a storage system in which data storage device may function as a storage device for a host device, according to one embodiment.

FIG. 1 is a schematic block diagram illustrating a storage system 100 in which data storage device 106 may function as a storage device for a host device 104, according to one embodiment. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 stores and/or retrieves data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered) to a motherboard of the host device 104.

The interface 114 of the data storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the interface 114 (e.g., the data bus, the control bus, or both) is electrically connected to the controller 108, providing electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The NVM 110 may include a plurality of memory devices. NVM 110 may be configured to store and/or retrieve data. For instance, a memory device of NVM 110 may receive data and a message from the controller 108 that instructs the memory unit to store the data. Similarly, the memory device of NVM 110 may receive a message from the controller 108 that instructs the memory device to retrieve data. In some examples, each of the memory devices may be referred to as a die. In some examples, a single physical chip may include a plurality of dies (i.e., a plurality of memory units). In some examples, each memory device may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory device of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

The NVM 110 may comprise a plurality of flash memory devices. NVM flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The data storage device 106 includes a power supply 111, which may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, supercapacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The data storage device 106 also includes volatile memory 112, which may be used by controller 108 to store information. Volatile memory 112 may include one or more volatile memory devices. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The data storage device 106 includes a controller 108, which may manage one or more operations of the data storage device 106. For instance, the controller 108 may manage the reading of data from and/or the writing of data to the NVM 110. Furthermore, the controller 108 is coupled to the buffer 116 via a flash bus 118, where the flash bus 118 facilitates the transfer of data between the controller 108 and the buffer 116. In one embodiment, the flash bus 118 may facilitate the transfer of data between the NVM 110 and the controller 108 and/or between the volatile memory 112 and the controller 108. In some embodiments, when the data storage device 106 receives a write command from the host device 104, the controller 108 may initiate a data storage command to store data to the NVM 110 and monitor the progress of the data storage command.

The controller 108 may determine at least one operational characteristic of the storage system 100 and store the at least one operational characteristic to the NVM 110. In some embodiments, when the data storage device 106 receives a write command from the host device 104, the controller 108 temporarily stores the data associated with the write command in the internal memory or write buffer 116 before sending the data to the NVM 110. The controller further includes a first flash transition layer (FTL) module 120. The first FTL module 120 may include one or more FTL tables configured to track the location of the newly updated data in the NVM 110, such that each read command for the newly updated data is routed to the appropriate location, ensure that newly programmed pages of the NVM 110 are evenly distributed across the NVM 110 to aid in wear leveling, and track the location of the outdated or invalid data, such that the one or more pages including the outdated or invalid data may be erased in a flash management operation such as garbage collection.

Figure 2:
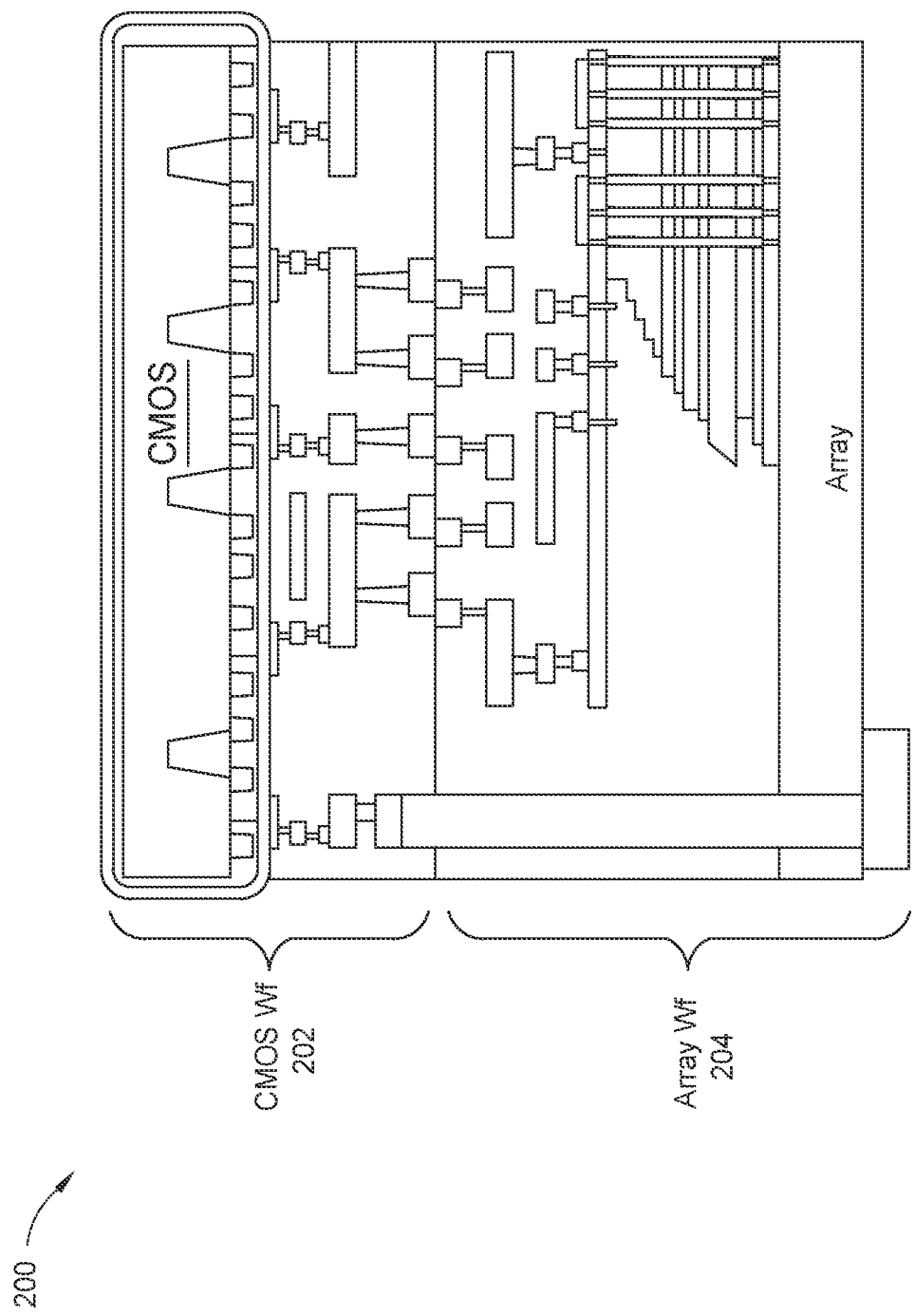
FIG. 2 is a schematic illustration of a circuit bounded array architecture, according to one embodiment.

FIG. 2 is a schematic illustration of a circuit bounded array (CbA) architecture 200, according to one embodiment. The CbA architecture 200 includes one or more complementary metal oxide semiconductor (CMOS) chips coupled to one or more arrays via one or more connection units, where the arrays correspond to one or more memory locations of the NVM 110, such as a first die of the plurality of dies of the NVM 110. The CMOS device and the associated architecture may be referred to as a CMOS work function (WF) 202, for exemplary purposes. Furthermore, the array and the associated architecture may be referred to as an array WF 204, for exemplary purposes.

In one embodiment, the CMOS WF 202 is a CMOS Above the Array (CAA) device. Because the CMOS device is separate from the array WF 204, the CMOS logic may be performed faster than previous adaptations, such as CMOS Under the Array (CuA). Each CMOS CAA device of the plurality of CMOS CAA devices includes an error correction code (ECC) module. The ECC module may be configured to encode and decode error correction codes to and from each of the relevant NVM dies.

FIG. 3 is a schematic illustration of a non-volatile memory device architecture 300, according to one embodiment. Aspects of the non-volatile memory device architecture 300 may be similar to the CbA architecture 200 of FIG. 2. For example, each memory die 306A-306E may be the array WF 204 and each CMOS device 302A-302E may be the CMOS WF 202. Each memory die 306A-306E may be an NVM die of the plurality of NVM dies of the NVM 110. Each of the CMOS devices 302A-302E includes an ECC unit of the plurality of ECC units 304A-304E. The number of CMOS devices 302A-302E, ECC units 304A-304E, and memory dies 306A-306E illustrated are not intended to be limiting, but to provide an example of a possible embodiment. In one embodiment, the non-volatile memory device architecture 300 includes an "n" number of CMOS chips, ECC units, and memory dies, where "n" represents any appropriate value, such as about 256. Furthermore, the plurality of CMOS device 302A-302E may be implemented as CMOS CAA, in one embodiment.

Because each memory die is coupled to a CMOS device and each CMOS device includes an ECC unit, the non-volatile memory device architecture 300 includes an equal number of memory dies, CMOS devices, and ECC units. The memory dies and the CMOS devices may be vertically arranged in an alternating fashion. For example, a first memory die 306A is deposited over the first CMOS device 302A and a second CMOS device 302B is deposited over the first memory die 306A. A second memory die 306B is deposited over the second CMOS device 302B and so-forth.

Furthermore, each CMOS device is coupled to an adjacent memory die. For example, the first CMOS device 302A is coupled to the first memory die 306A and the second CMOS device 302B is coupled to the second memory die 306B. Because the first CMOS device 302A is coupled to the first memory die 306A, the CMOS device 302A logic manages the programming and reading of data to and from the first memory die 306A.

For example, referring to FIG. 1, when the controller 108 receives a write command from the host device 104, the first FTL module 120 schedules to the data associated with the write command to a location in the NVM 110. The data associated with the write command is transferred to the relevant CMOS device, such as the first CMOS device 302A, where the first ECC unit encodes low-density parity check (LDPC) code and/or parity data to the data. Following encoding the data, the data is programmed to the associated first memory die 306A. For example, the data programmed to the first memory die 306A may be in a size of about 4.5 KB, where about 4 KB of data is associated with the write command and the remaining about 0.5 KB of data is associated with metadata, such as LDPC code and/or parity data.

When the controller 108 receives a read command from the host device 104, the first FTL module 120 utilizes the FTL tables to locate the relevant data in the one or more memory dies 306A-306E. After locating the location of the relevant data in the FTL tables, the relevant CMOS device, such as the first CMOS device 302A, retrieves the data from the relevant memory die, such as the first memory die 306A. The data is decoded by the relevant ECC unit, such as the first ECC unit 304A, before the data is delivered to the controller 108. The decoded data is the programmed data minus the metadata, such that the decoded data has a size of about 4 KB. In one embodiment, the controller 108 may be configured to compare the decoded data with the data stored in the FTL tables of the first FTL module 120. After confirming that the decoded data matches the data stored in the FTL tables of the first FTL module 120, the controller 108 is configured to relocate the valid data to a different non-volatile memory device, such as the second memory die 306B. The first FTL module 120 is configured to update the FTL table with the relevant location of the relocated valid data. An example of the previously described operation may be a data management operation, such as garbage collection.

Figure 4:
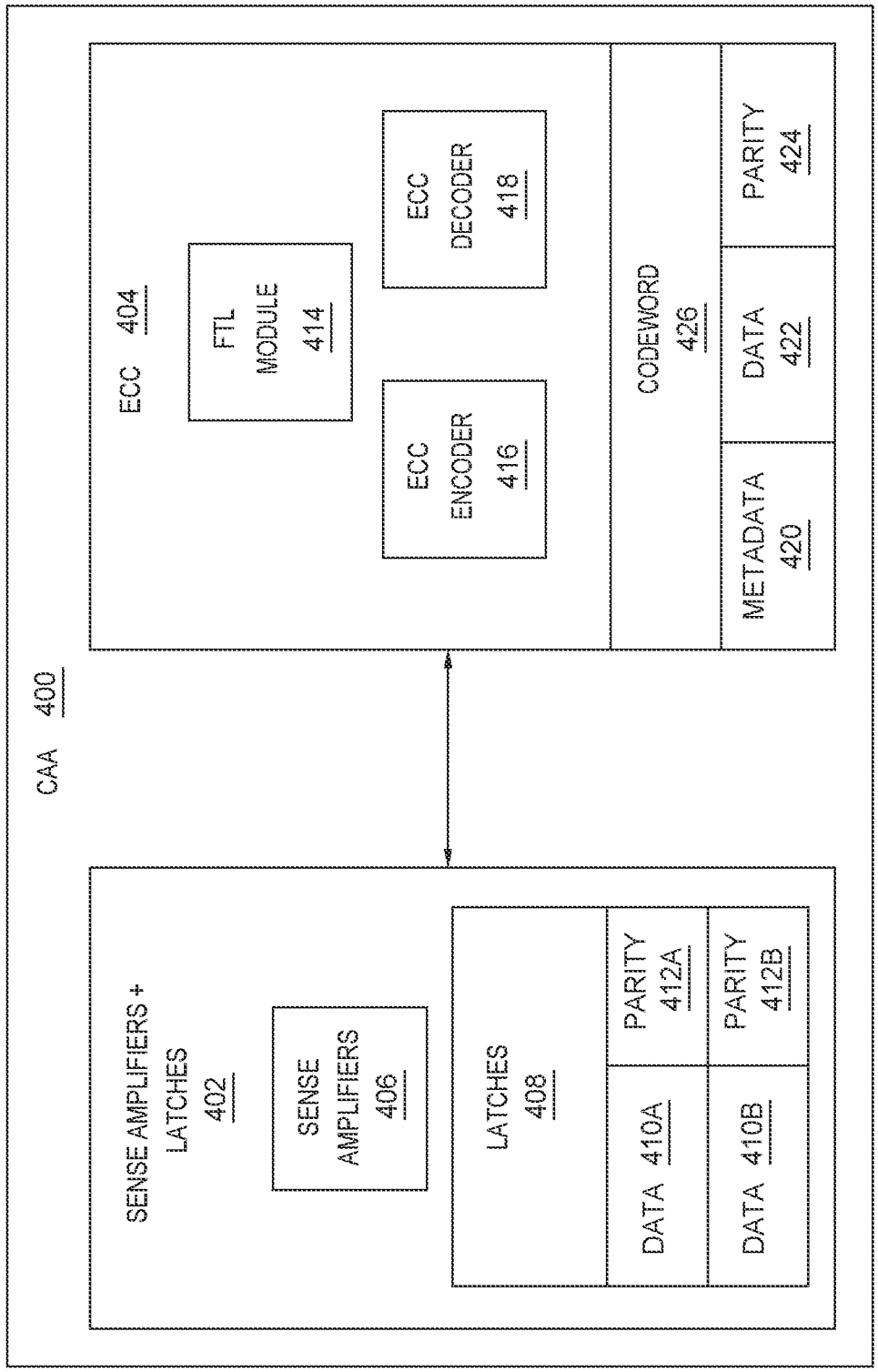
FIG. 4 is schematic illustration of a CMOS above the array (CAA) chip, according to one embodiment.

FIG. 4 is schematic illustration of a CMOS above the array (CAA) chip 400, according to one embodiment. The CAA chip 400 may be implemented as at least one of the CMOS devices 302A-302E of FIG. 3, where the ECC 404 may be implemented as at least one of the ECC units 304A-304E of FIG. 3. The CAA chip 400 includes a sense amplifiers and latches 402 and an ECC unit 404. The sense amplifiers and latches 402 may communicate with the ECC unit 404. For example, when the controller, such as the controller 108 of FIG. 1, receives a read command, the read command is transferred to the appropriate CMOS device, such as the CAA chip 400 by way of a flash bus, such as the flash bus 118. The CAA chip 400 senses the relevant one or more wordlines, where the sense amplifiers 406 amplify the low power signals that represent a bit of a memory cell to a recognizable logic level. The latches 408 latch the desired one or more wordlines, where the one or more wordlines includes a first data 410A and a first parity 412A or a second data 410B and a second parity 412B.

The data 410A, 410B and the parity 412A, 412B are transferred to the ECC 404 as a codeword 426. Each codeword 426 includes metadata 420, data 422, and parity 424. For example, the data 410A may be the metadata 420 and the data 422. The ECC encoder 416 may be responsible for encoding parity or LDPC code to the received data associated with a host write command. The ECC decoder 418 may be responsible for decoding the codeword 426 to check for any failed bits as well as correct any failed bits. The second FTL module 414 is a local FTL module relative to the ECC 404 of the CAA chip 400. The second FTL module 414 may have a similar functionality as the first FTL module 120 of the controller 108 of FIG. 1. The second FTL module 414 may be configured to extract the metadata 420 from the codeword 426 and transfer the metadata 420 to the controller 108 of FIG. 1.

For example, during controller 108 initiated operations, such as garbage collection, the controller 108 may generate a read command for a first block in the first memory die 306A of the NVM 110. The read command is transferred to the first CMOS device 302A, where the first CMOS device 302A may be a CAA chip 400. The sense amplifiers and latches 402 of the CAA chip 400 senses and amplifies the relevant data and parity associated with the read command, such as the first data 410A and the first parity 412A associated with the first data 410A. The latches 408 latches the first data 410A and the first parity 412A to a codeword 426, such as a first codeword. The first codeword is then transferred to the ECC 404, where the ECC decoder 418 decodes the first codeword and the second FTL module 414 extracts the metadata 420. The second FTL module 414 sends the metadata 420 to the controller 108, more specifically the first FTL module 120. The first FTL module 120 determines if the data 422 or portions of the data 422 is valid by checking the FTL tables. The valid portions of the data 422 are then encoded by the ECC encoder 416 before the CAA chip 400 writes the valid data to a newly allocated block of the first memory die 306A, where the second FTL module 414 stores the location of the valid data. The ECC encoder 416 may attach a metadata header to the valid data as well as LDPC code and/or parity data associated with the valid data.

Figure 5:
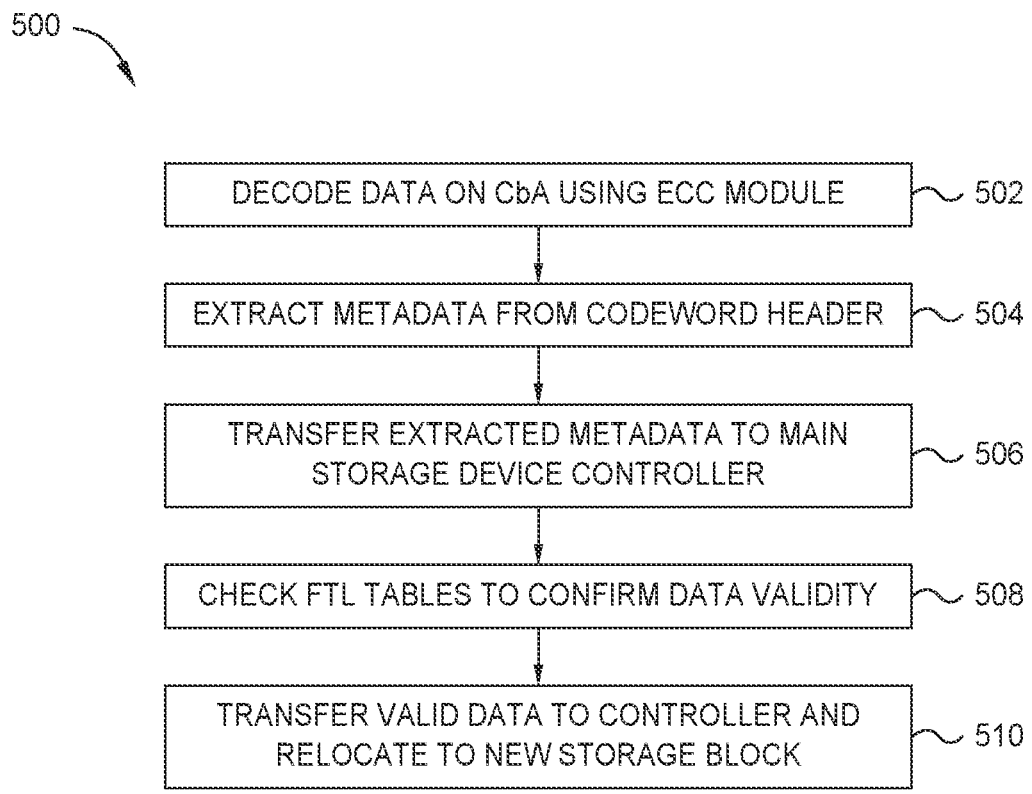
FIG. 5 is a flowchart illustrating a data relocation method, according to one embodiment.

FIG. 5 is a flowchart illustrating a data relocation method 500, according to one embodiment. Aspects of FIG. 4 may be referred to provide context to the data relocation method 500. The aspects of FIG. 4 provided are not intended to be limiting, but to provide an example of a possible embodiment. At block 502, the codeword associated with a read command is decoded by the ECC module, such as the ECC 404 of FIG. 1, of the CbA chip, such as the CAA chip 400 of FIG. 4. The data and the corresponding parity associated with the codeword 426 is sensed and latched by the sense amplifiers and latches 402. The codeword 426 is transferred to the ECC, where the ECC decoder decodes the codeword 426.

At block 504, the second FTL module 414 of the ECC 404 extracts the metadata 420 from the codeword 426, where the metadata 420 may be stored in the header of the codeword 426. At block 506, the extracted metadata 420 is transferred to the controller, such as the controller 108 of FIG. 1. The FTL module, such as the first FTL module 120, of the controller checks the metadata 420 against the FTL tables to confirm the validity of the data 422 at block 508. At block 510, the valid data is transferred to the controller and reallocated to a new storage block, such as a second memory die 306B of FIG. 3, where the second CMOS device 302B is configured to encode and store the data to the second memory die 306B.

Figure 6:
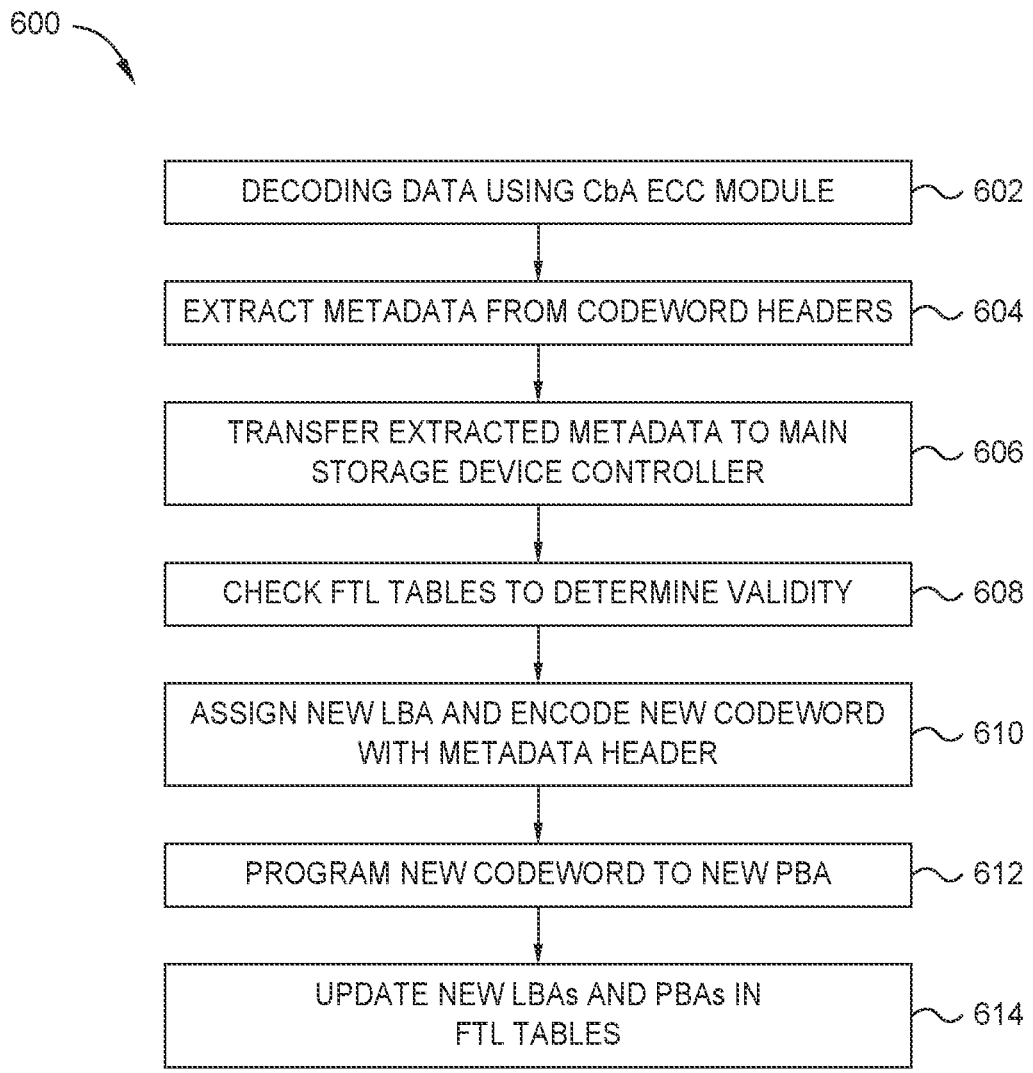
FIG. 6 is a flowchart illustrating data relocation method, according to another embodiment.

FIG. 6 is a flowchart illustrating data relocation method 600, according to another embodiment. The data relocation method 600 differs from the data relocation method 500 because the method 500 is concerned with relocating data to a newly allocated block in a different die of the NVM 110, whereas the method 600 is concerned with relocating data to a newly allocated block in the same die of the NVM 110. Aspects of FIG. 4 may be referred to provide context to the data relocation method 600. The aspects of FIG. 4 provided are not intended to be limiting, but to provide an example of a possible embodiment.

At block 602, the codeword associated with a read command is decoded by the ECC module, such as the ECC 404 of FIG. 1, of the CbA chip, such as the CAA chip 400 of FIG. 4. The data and the corresponding parity associated with the codeword 426 is sensed and latched by the sense amplifiers and latches 402. The codeword 426 is transferred to the ECC, where the ECC decoder decodes the codeword 426.

At block 604, the second FTL module 414 of the ECC 404 extracts the metadata 420 from the codeword 426, where the metadata 420 may be stored in the header of the codeword 426. At block 606, the extracted metadata 420 is transferred to the controller, such as the controller 108 of FIG. 1. The FTL module, such as the first FTL module 120, of the controller checks the metadata 420 against the FTL tables to confirm the validity of the data 422 at block 608.

At block 610, the second FTL module 414 assigns a new LBA to valid data. The valid data or new codeword is re-encoded by the ECC encoder 416 with metadata 420 header and parity 424. At block 612, the CAA chip 400 programs the new codeword to a new physical block address (PBA), where the new PBA is a newly allocated block of the same die of the NVM 110, such as the first memory die 306A. At block 614, the FTL tables of the first FTL module 120 are updated with the new LBAs and the PBAs of the newly programmed data to the newly allocated block.

By implementing an ECC module in a CMOS chip for each memory die within a memory array of a memory device, the data can be relocated more efficiently. Because only decoded and extracted metadata is transferred to the FTL module prior to a data validity check, only valid data, other than any metadata that indicates invalid data is present, moves across the flash bus. Therefore, more efficient data relocation is achieved.

In one embodiment, a data storage device comprises: a controller; and a non-volatile memory device coupled to the controller, wherein the non-volatile memory device comprises: at least one memory die; and at least one complementary metal oxide semiconductor (CMOS) device coupled to the at least one memory die, wherein the CMOS device comprises an error correction code (ECC) unit. The ECC unit comprises a flash translation layer (FTL) module, an encoder, and a decoder. A number of CMOS devices is equal to a number of memory dies. The non-volatile memory device is capable of delivering decoded metadata to the controller. The at least one memory die comprises a plurality of memory dies. The at least one CMOS device comprises a plurality of CMOS devices. The plurality of memory dies and the plurality of CMOS devices are vertically arranged in an alternating fashion. The at least one CMOS device comprises at least one sense amplifier and at least one latch. The controller includes a flash translation layer (FTL) module.

In another embodiment, a data storage device comprises: a controller; and a non-volatile memory device coupled to the controller, wherein the non-volatile memory device is configured to: decode data; extract metadata from the decoded data; and transfer the extracted metadata to the controller. The controller is configured to compare the extracted metadata to data stored in a flash translation layer (FTL) table. The non-volatile memory device is further configured to transfer valid data to the controller in response to the comparing. The controller is configured to relocate the valid data to a different non-volatile memory device. The non-volatile memory device is further configured to assign a new logical block address (LBA) to valid data. The non-volatile memory device is further configured to encode a new codeword with new metadata header for the new LBA. The non-volatile memory device is further configured to program the new codeword to a new physical block address (PBA). The controller is further configured to update a flash translation layer (FTL) table with the new LBA and the new PBA.

In another embodiment, a data storage device comprises: a controller; and a non-volatile memory device coupled to the controller, wherein the non-volatile memory device comprises means to decode data stored in the non-volatile memory device. The non-volatile memory device comprises a first flash translation layer (FTL) module. The controller comprises a second FTL module distinct from the first FTL module. The non-volatile memory device is configured to extract metadata from decoded data and send the extracted metadata to the controller. The controller is configured to compare the extracted metadata to data stored in a flash translation layer (FTL) table in the controller.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
 a controller; and
 a non-volatile memory device coupled to the controller, wherein the non-volatile memory device is configured to:
  decode data;
  extract metadata from the decoded data; and
  transfer the extracted metadata to the controller, and wherein the non-volatile memory device comprises:
   at least one memory die; and
   at least one complementary metal oxide semiconductor (CMOS) device coupled to the at least one memory die, wherein the CMOS device comprises an error correction code (ECC) unit.

2. The data storage device of claim 1, wherein a number of CMOS devices is equal to a number of memory dies.

3. The data storage device of claim 1, wherein the at least one memory die comprises a plurality of memory dies, wherein the at least one CMOS device comprises a plurality of CMOS devices, and wherein the plurality of memory dies and the plurality of CMOS devices are vertically arranged in an alternating fashion.

4. The data storage device of claim 1, wherein the at least one CMOS device comprises at least one sense amplifier and at least one latch.

5. The data storage device of claim 1, wherein the controller includes a flash translation layer (FTL) module.

6. A data storage device, comprising:
 a controller; and
 a non-volatile memory device coupled to the controller, wherein the non-volatile memory device comprises:
  at least one memory die; and
  at least one complementary metal oxide semiconductor (CMOS) device coupled to the at least one memory die, wherein the CMOS device comprises an error correction code (ECC) unit, wherein the ECC unit comprises a flash translation layer (FTL) module, an encoder, and a decoder.

7. A data storage device, comprising:
 a controller; and
 a non-volatile memory device coupled to the controller, wherein the non-volatile memory device is configured to:
  decode data;
  extract metadata from the decoded data; and
  transfer the extracted metadata to the controller.

8. The data storage device of claim 7, wherein the controller is configured to compare the extracted metadata to data stored in a flash translation layer (FTL) table.

9. The data storage device of claim 8, wherein the non-volatile memory device is further configured to transfer valid data to the controller in response to the comparing.

10. The data storage device of claim 9, wherein the controller is configured to relocate the valid data to a different non-volatile memory device.

11. The data storage device of claim 9, wherein the non-volatile memory device is further configured to assign a new logical block address (LBA) to valid data.

12. The data storage device of claim 11, wherein the non-volatile memory device is further configured to encode a new codeword with new metadata header for the new LBA.

13. The data storage device of claim 12, wherein the non-volatile memory device is further configured to program the new codeword to a new physical block address (PBA).

14. The data storage device of claim 13, wherein the controller is further configured to update a flash translation layer (FTL) table with the new LBA and the new PBA.

15. A data storage device, comprising:
   a controller; and
   a non-volatile memory device coupled to the controller, wherein the non-volatile memory device comprises:
      means for decoding data stored in the non-volatile memory device;
      means for extracting metadata from decoded data; and
      means for sending the extracted metadata to the controller.

16. The data storage device of claim 15, wherein the non-volatile memory device comprises a first flash translation layer (FTL) module.

17. The data storage device of claim 16, wherein the controller comprises a second FTL module distinct from the first FTL module.

18. The data storage device of claim 15, wherein the controller is configured to compare extracted metadata to data stored in a flash translation layer (FTL) table in the controller.

* * * * *